United States Patent
Adiga et al.

(10) Patent No.: US 6,955,063 B2
(45) Date of Patent: Oct. 18, 2005

(54) COOLING OF ELECTRONICS AND HIGH DENSITY POWER DISSIPATION SYSTEMS BY FINE-MIST FLOODING

(75) Inventors: Kayyani C. Adiga, Macon, GA (US); Rajani Adiga, Macon, GA (US); Robert F. Hatcher, Jr., Macon, GA (US)

(73) Assignee: Nanomist Systems, LLC, Warner Robins, GA (US)

( * ) Notice: Subject to any disclaimer, the term of this patent is extended or adjusted under 35 U.S.C. 154(b) by 0 days.

(21) Appl. No.: 10/460,873

(22) Filed: Jun. 14, 2003

(65) Prior Publication Data

US 2004/0250562 A1 Dec. 16, 2004

(51) Int. Cl.$^7$ .............................. F25D 23/12; H05K 7/20; F28F 7/00
(52) U.S. Cl. .................... 62/259.2; 62/304; 361/699; 361/698; 165/80.4
(58) Field of Search .................. 62/310, 314, 304, 62/259.2, 121, 376, 64; 361/699, 698, 689, 691, 695, 688; 239/584, 555; 165/80.4

(56) References Cited

U.S. PATENT DOCUMENTS

| | | | | |
|---|---|---|---|---|
| 4,284,239 A | * | 8/1981 | Ikeuchi | 239/8 |
| 4,783,008 A | * | 11/1988 | Ikeuchi et al. | 239/421 |
| 5,797,274 A | * | 8/1998 | Jackaman et al. | 62/171 |
| 5,907,473 A | * | 5/1999 | Przilas et al. | 361/699 |
| 5,943,211 A | * | 8/1999 | Havey et al. | 361/699 |
| 6,349,554 B2 | * | 2/2002 | Patel et al. | 62/259.2 |
| 6,377,453 B1 | * | 4/2002 | Belady | 361/687 |
| 6,604,370 B2 | * | 8/2003 | Bash et al. | 62/171 |

* cited by examiner

Primary Examiner—Chen Wen Jiang
(74) Attorney, Agent, or Firm—Brian D. Bellamy

(57) ABSTRACT

A cooling method and apparatus including a mist-generating device is configured to generate a mist of droplets from water, dielectric liquids or any cooling liquids. The mist is produced having such volume, momentum, concentration and quality of scale so as to deter or avoid impingement or deposition of the mist droplets on a surface to be cooled or on surfaces within a heat dissipating system to be cooled. Effective cooling is provided by the high latent heat of vaporization of water or other suitable fluid, while surfaces normally subject to possible damage by wetting are protected from harmful contact from the fluid.

Tangential flow technology and electronic ultrasonic atomizing devices may be used as one possible means to generate the required mist and control mist volume, momentum, concentration and quality. Other variables may be controlled to enhance the cooling of the mist, such as flow patterns and flow directions of the mist. Vaporized mist may be condensed and recovered. The cooling method may be used to replace or complement existing air-cooled systems.

25 Claims, 3 Drawing Sheets

COOLING OF ELECTRONICS AND HIGH DENSITY POWER DISSIPATION SYSTEMS BY FINE-MIST FLOODING

BACKGROUND OF THE INVENTION

1. Field of the Invention

The present invention relates to a method of cooling heat releasing devices that must be cooled for their continuous and efficient functioning. More particularly, a method is provided for cooling by flooding electronics or other high-density power dissipation systems with a fine mist without directly impacting or wetting the system.

2. Description of the Prior Art

The removal of the heat load from electronic systems densely packed into ever-smaller spaces is a great challenge in thermal management, especially with the ever-increasing power of these systems. Other high-density power dissipation systems face similar challenges in heat source cooling applications. While the electronics industry strives to satisfy the increasing market demand for faster, smaller, lighter, and cheaper electronic devices through miniaturization, increasing power density in those devices tests the practical limits of traditional forced air convection cooling. Thus, the heat dissipation requirements of these electronics and high-density systems are rapidly becoming a limiting factor to their continued improvement.

Presently, thermal management of heat dissipation is accomplished by several cooling methods, both conventional and new, including natural air convection, forced air convection, conduction, heat-pipe technology, and radiation. Increasingly, these methods do not provide adequate cooling efficiency to maintain appropriate system temperatures under the extreme thermal environments being encountered. More recent research efforts have focused on dielectric liquid cooling, both by direct contact and spray technology. While more efficient in cooling power, these technologies have disadvantages associated with direct contact, sealed, wet systems.

U.S. Pat. No. 5,220,804 to Tilton, et al. discusses spray evaporative cooling of heat sources. Tilton teaches pressure atomizer nozzles arranged in arrays for deposition of a thin film of liquid onto a heat source. Upon phase change from liquid to gas, the film of liquid on the heat source cools the surface of electronics packed in an enclosure. Several references are provided in this patent (U.S. Pat. No. 5,220,804) regarding both spray and jet impingement cooling methods, wherein droplets of liquid cool the heat source surface by the contact and subsequent vaporization of the droplets. Tilton describes the direct impingement spray cooling method with a review of various parameters of importance such as spray angle, spray momentum, nozzle array geometry, uniform versus non-uniform cooling, targeted versus uniform spray, and liquid condensation. Isothermal System Research (ISR) appears to be pursuing this technology aggressively through SBIR grants from the U.S. NAVY. ISR has contributed significantly to commercial off the shelf (COTS) electronics cooling. ISR has utilized dielectric liquids as shown in Table 1 later. ISR has not been known by the present inventor to use water as coolant or to teach the fine-mist cooling method taught herein.

The spray cooling method developed by ISR appears to stem from U.S. Pat. No. 5,220,804. The ISR methodology uses direct impingement of liquid onto a heat source and has several limiting characteristics or disadvantages thereof. First, the ISR system must be highly engineered for successful implementation. For instance, the spray cooling system in the Tilton reference has a complex infrastructure including pressure spray nozzles and complex fluid handling systems, and the system has great potential for disadvantages including nozzle corrosion, erosion due to contaminants, and liquid recovery problems. The costs associated with these direct impingement systems make these systems less attractive. Consequently, new technology is still needed to address the thermal management needs of COTS electronics packages and prevent heat sources from causing catastrophic thermal failure.

U.S. Pat. No. 6,498,725 to Cole, et al. again teaches an evaporative spray cooling system using direct impingement of liquid on surfaces for removing high heat fluxes from surfaces of devices such as micro-electronic chips, metal, mirrors, and lasers. The system uses expanding two-phase flow and a method of controlling the spray for optimum heat flux removal. Controls include spray atomization, fluid-phase, mass flow, and spray temperature. A wide variety of spray atomizers exist. Cole teaches that for electronic cooling of chips with exposed leads or exposed electrical surfaces, the cooling fluid must have a high dielectric constant; otherwise the fluid may short circuit the chip causing it to fail.

Within the field of evaporative spray cooling using pressure-type atomizers, efforts have concentrated on manipulating conditions for improving deposition of the spray and the mechanics of impingement on the surface being cooled. Several atomization conditions have been explored and addressed including uniformity of spray, cooling surface coverage, momentum losses, and spray evaporation losses.

The authors of the present invention have not encountered work in patent literature or in the public domain discussing the merits of cooling electronics and/or heat dissipating systems using fine-mist flooding or circulating a fine mist within a system or electronics cabinet. The only reference found is to direct impingement spray cooling by water. According to a press release later presentation at a conference by University of California (UCLA) professors, directed spray jets were used to direct water droplets of about 35 micron diameter onto heat dissipating elements. In place of dielectric liquid spray disclosed by the above references, UCLA used pressurized water spray, while protecting electrical systems and the like with a coating. In the paper UCLA presented at the Eighth Intersociety Conference on Thermal and Thermo mechanical Phenomena in Electronic Systems, the scientists describe effective cooling by direct impingement spraying of water on high power density variable speed drive motors. The work reports effective thermal management using direct water sprays of high power devices in three-phase 18 hp AC motor drives. In order to protect the system from electrical shorting, the methodology used a coating of a copolymer, referred to as parylene, on sensitive surfaces.

The above work on direct impingement spray systems differs widely from the present invention in that spray cooling with water is simply a different direct impingement coolant from the dielectric liquid that was already taught by several inventors. Although the UCLA work shows more efficient cooling compared to dielectric liquids because of the high latent heat of vaporization, the technology is still complex, particularly because of the advanced coating required, requires a huge infrastructure to implement, and involves direct wetting of the heat source. Furthermore, the 35-micron droplets are still too large to absorb energy efficiently, and existing air-cooled systems cannot be refitted to use these technologies.

Thus, a cooling method for electronics and other heat dissipating systems is still needed to absorb and carry away large amounts of heat rapidly. The preferred system would take advantage of the extensive cooling design work already incorporated into most heat producing systems, would not require the extensive infrastructure associated with wetting systems, and would not cause physical degradation or breakdown. Preferably, the mist should be produced without pressure in order to avoid having a complicated fluid handling system with pumps and pressure lines.

SUMMARY OF INVENTION

The main objective of this invention is to provide an efficient cooling method for heat release elements. Specifically, the invention provides cooling for electronics and computers. The present invention refers to, but is not limited to, cooling computers, electronics systems, and commercial-off-the-self (COTS) systems packed with electronics. Other applications may also include cooling high power density variable speed motor drive devices and other systems that require the dissipation of large amounts of heat rapidly. Still further applications will be described in various embodiments in this document or will be encompassed by the claims and would be considered within the intended scope of the invention.

To accomplish the goals of efficient rapid cooling without the disadvantages of direct impingement dielectric fluid systems, the authors herein have designed a system that satisfies these goals by flooding a high density system, referred to herein as HDS, with extremely small droplets of fog of a dielectric fluid or water. In general, the ultra-fine mist is generated having droplet size less than five microns or, moreover, less than one micron. The extremely small droplets flood the HDS in a pseudo gas like behavior, whereby the small droplets penetrate hard to reach places and pass through densely packed systems providing uniform cooling of otherwise discrete heating spaces.

The invention provides for operation of powerful cooling mechanisms through vaporization of extremely small droplets of heat absorbing liquids. The huge combined surface area of the droplets accelerates the evaporation and cooling process. Thus, rapid cooling is accomplished through the rapid absorption of the energy inside the system. A boundary layer heat transfer process absorbs the energy or heat directly from the heating element or heat sink. The heat transfer process between the convection boundary layer and heated surface provides effective cooling and avoids direct impact or deposition of the fluid on surfaces. Thus, the present invention does not spray coolant onto the heat source and does not wet the heat source. Instead, the convection boundary layer provides protection to the system from harmful wetting. Therefore, erosion, corrosion, wetting and adverse effect on system parts or circuit conduction is avoided by the present invention.

Although the invention refers to mist cooling in general, using a change of phase (COP) liquid such as dielectric liquids, other liquid-based coolants, and water; specific reference is made to fine-mist of water as a powerful coolant because of its extremely high latent heat of vaporization. Heretofore, the ability to uses water mist as a coolant has been considered impractical because of the damage caused by direct impact and wetting. However, the present invention broadens the scope of COP liquids that may be used in cooling. Thus, more efficient cooling can be accomplished because of the ability to now use water and other liquids with desirable physical characteristics. For example, water has a high specific heat and roughly 28 times the latent heat of vaporization as compared with fluorocarbons (See Table 1).

The fine mist generator in the invention may be combined with the present mechanical features of air-cooled systems that are already have flow optimized for cooling of hot spots. Thus, the present system may use existing inlet ports for introducing and flooding heat-generating systems with the fine mist disclosed and use existing outlet exhaust ports for either recirculating or exhausting from the machine.

Several objectives are satisfied by the invention.

One objective of the invention is to use micro droplets of fluid mist carried by cooling air though an HDS so that the droplets are not targeted to selected location for impaction.

Another objective is to use extremely small droplets to perform cooling through rapid vaporization without direct impingement or deposition of the droplets on surfaces.

Another objective is to provide effective cooling while protecting electronic parts and other sensitive systems from damage.

Another objective of this invention is to provide a method of producing a cooling mist of extremely fine droplets using ambient pressure mist generation, while avoiding pressure based systems and complex fluid handling systems.

Another objective is to provide a method of cooling HDS having a simple infrastructure that is easy to install without requiring continuing maintenance, unlike pressure atomization systems, nozzle based spray systems, or complex fluid handling systems.

Another objective of the invention is to provide a method of flooding and cooling heat generating systems by pulling the fine mist through a plenum or existing air inlet port and when desired recovering the vapor by condensation.

Another objective of the invention is to provide a method of flooding and cooling heat generating systems by pulling the fine mist through a plenum or existing air inlet port and varying the mist concentration through a self-controlling feedback process loop, which allows adjusting mist concentration as the heat load demands for effective cooling.

DETAILED DESCRIPTION OF THE INVENTION

As electronics and other heat generating systems become more compact or powerful, thermal management is becoming more difficult. Water or water mist has heretofore been avoided as a cooling mechanism despite its excellent physical properties and ready availability because of its deleterious effect on mechanical and electrical systems. In particular, water mist deposition on a circuit board or the like will quickly short-circuit and damage electronic systems. The present invention resolves the obstacles of using more efficient cooling liquids such as water in cooling electronics and high-density power dissipation systems. The invention provides for a fog or gas-like mist of ultra-fine droplets that enable flooding and cooling of a heat dissipating system without impingement or deposition of the mist fluid on the surfaces of the system. The mist fluid method provided by the invention may be used in combination with air-cooled systems or may be engineered to replace air-cooled systems or other types of cooling systems that may be improved.

Specifically, the invention provides cooling for electronics and computers and other high-density power dissipation systems, but it certainly is not limited thereto and may be used for cooling in any needed environment that provides a heat generating surface or element or heat dissipating system. Other examples include heat sinks, machinery, engines, machining tools, and laser cutting devices.

Figure 1:
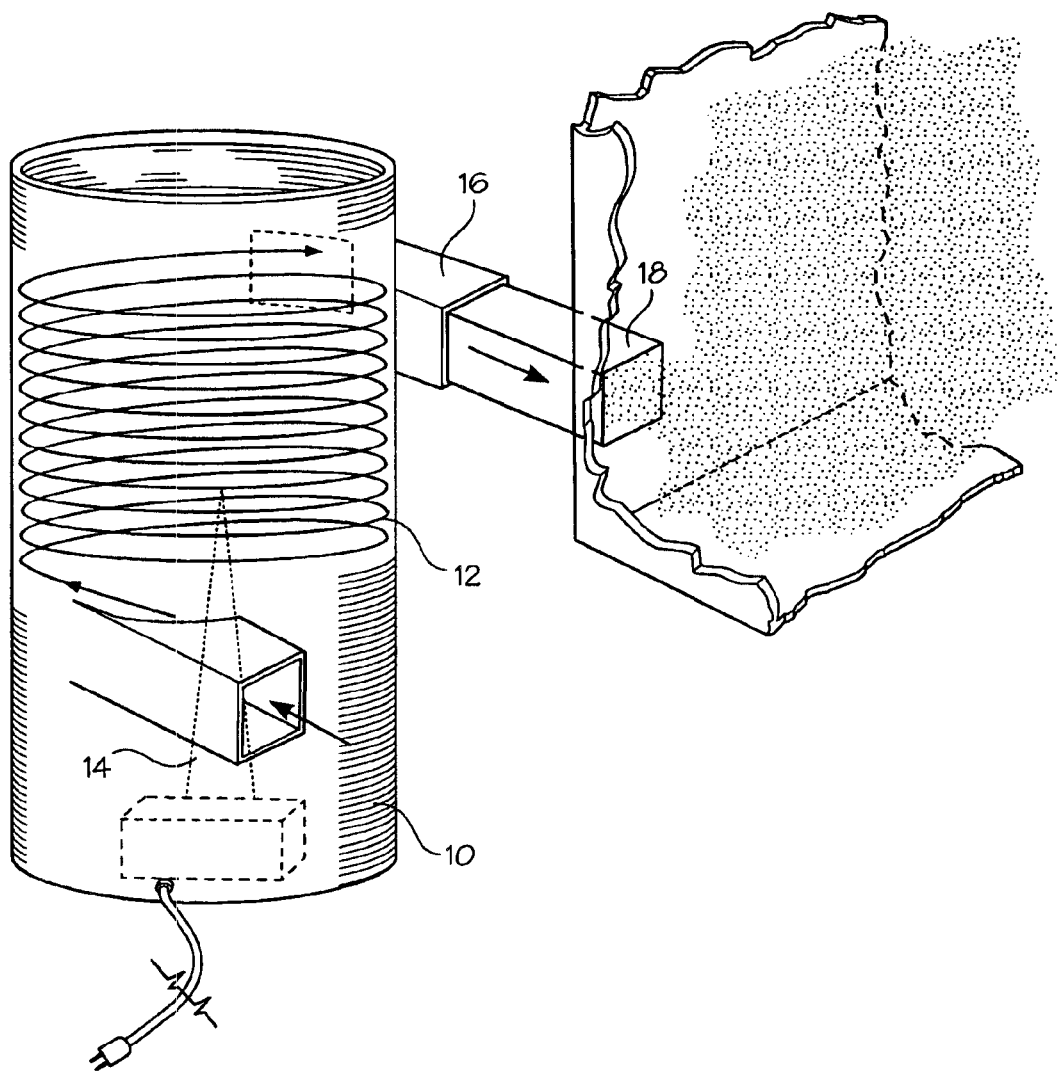
FIG. 1 is shows a system for the production of mist in sufficient quantity to flood electronics or large-scale HDS such as a computer/electronics system

During mist production, the mist issues out of an outlet 16, such as the tube shown in FIG. 1. The mist may be generated by ultrasonic atomization device 10 and issued at very low momentum to retain the quality of the mist composition. It is important that the mist be of high quality. In other words, the mist should comprise primarily mist droplets of very fine scale, generally less than 5 micron and should be properly aerosolized so as to remain relatively stable. In fact, depending upon the application, it may be important for virtually all of the droplets comprising the mist to be of certain scale, or else undesired impingement or deposition of the mist onto the surface of the article being cooled may occur. In some applications, it may be desirable for substantially all of the mist droplets to be less than one micron in diameter. For instance, in electronics cooling, sub-micron diameter droplets may create a more controlled convection boundary layer that will avoid accidental short-circuiting of the exposed conduction leads.

In the invention micro and sub-micron sized droplets are carried by air though a system without directly targeting the droplets to selected location for impaction. Instead the system is flooded with the gas-like mist. The method does not require modification of present air-cooled systems designs. Instead of modifying current design, the airflow already optimized for efficient cooling of hot spots may be used to circulate the mist and flood the system with both air and mist. Thereby, the methodology provided for cooling by fine mist may utilize the existing inlet port 18 for entry of the mist and outlet exhaust ports 20 for either re-circulating or exhausting the mist from the machine.

FIG. 1 shows a typical mist-producing device 10 for creating extremely small droplets of mist of less than ten microns or preferably less than one micron in diameter. In a preferred embodiment, various dielectric liquids, and also water, may be provided in a reservoir and generated into mist. The mist-producing device 10 should produce a high quality, stable mist comprised of droplets of the desired size. Further, the mist-producing device should preferably use ambient pressure mist generation and avoid using pressurized systems, though this is not demanded by the invention. Pressurized systems generally require additional complex and expensive mechanical features and complex fluid handling infrastructure and are less safe.

One embodiment of the mist-producing device 10 in FIG. 1 would provide for generation of a high quality mist using ultrasonic piezoelectric transducers in communication with the reservoir of fluid. The mist created by the ultrasonic waves could then be classified using complementary tangential flow 12 technology to separate the smaller droplets from a plume 14 of mist created by the ultrasonic waves. A low momentum flow of carrier medium entrains the mist droplets and directs the high quality mist to the desired inlet area 16 for flooding. While ultrasonic atomization may be preferable, the extremely small (<5 micron) pseudo-gas type mist or fog used as the cooling medium in this invention may be produced by other means such as pressure atomization and the means of production is not limited to any particular methodology.

The invention provides a viable process technology for cooling computer/electronics and other heat generating systems 22 using a noninvasive continuous flooding ultra-fine liquid mist cooling technology without modifying existing design. The extremely small size of the droplets of liquid or water enables the process to trap all the heat energy from heating elements 24. Effective fog droplets should generally be less than 5 micron in diameter and should provide physical characteristics resulting in rapid vaporization. The micron level water droplets can be flooded into electronics systems, wherein the near ambient vaporization of the fine water droplets extracts heat by boundary layer cooling. The boundary layer acts to protect the system from harmful wetting. Further, the extremely small droplets flood the heat dissipating system 22 like a gas and penetrate hard to reach places and pass through densely packed systems. Thereby, the pseudo-gas mist provides uniform cooling of otherwise discrete heating spaces.

In this approach, heat or energy is absorbed by a free convection boundary layer heat transfer process, which avoids direct impact of droplets on system components. The methodology may be effective using both dielectric droplets and water droplets, which absorb energy through a thin boundary layer surrounding the heating surface. Thus, the present approach avoids erosion, corrosion, wetting and adverse effect on system parts or circuit conduction.

Both for dielectric droplets and water mist, the energy absorption takes place through a thin boundary layer surrounding each droplet, thus reducing the impact of mist on system corrosion, erosion or circuit shorting by condensed liquid. The present invention does not spray coolant onto the heat source and does not wet the heat source. Unlike the prior art, the present invention uses the heat absorption from the vaporization of mist dispersed in a carrier gas, creating a boundary layer between the heat source and the coolant mist. The components to be cooled are protected by the mist vaporization in the boundary layer of heat, which may be augmented by coating with appropriate protective materials. Liquids used should not adversely affect the contents inside the chamber being cooled. In some cases, particularly when water is used, thin dielectric film coating, copolymers or hydrophobic gel, or other protective substances may protect contents. Heat sink grease can also be used to protect sensitive areas. However, the risks of contact of sensitive parts with the liquid mist is minimized or eliminated by the process using a mist of extremely fine scale droplets, and the quality of mist droplets may be improved to further eliminate this risk depending upon the most advantageous cost/benefit configuration.

The cooling power of the mist is greatly enhanced by the large increase in surface area associated with nearly micron-sized mist droplets, which vaporize rapidly and absorb energy inside the system. A surface area increase of 12,000 times can be accomplished by reducing droplet size from 35 micron to nearly 1 micron as described in our invention. The commensurate increase in vaporization rate promotes rapid heat exchange.

Figure 2:
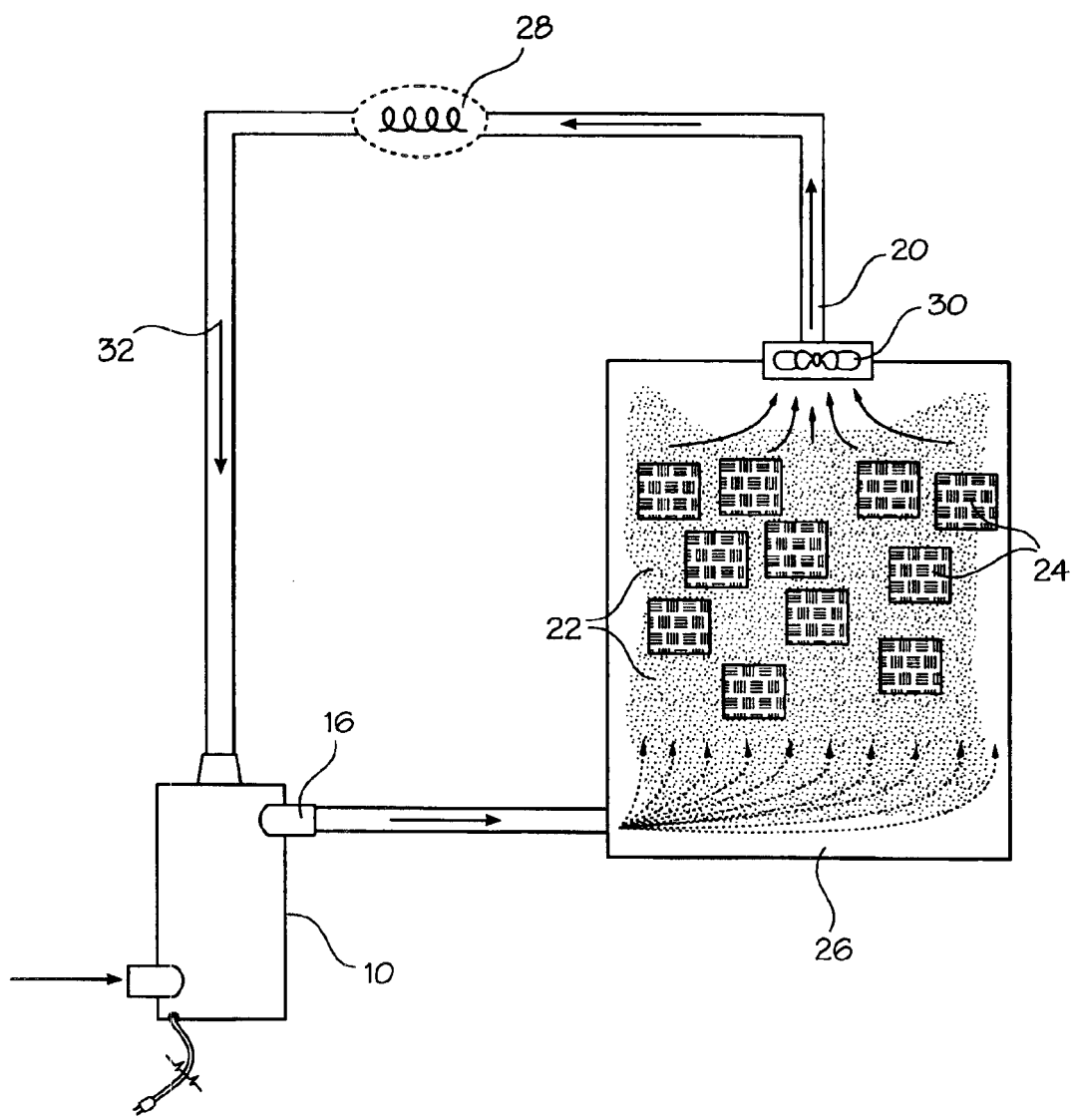
FIG. 2 is a schematic plan of an electronics system and the way fine mist is flooded or circulated into the system volume. The plenum and mist vapor recovery systems are shown.

The mist coming out of the generating device can be directly connected to the plenum of the electronics or system as shown in FIG. 2 at its base 26. The system may be flooded by pulling the mist through the plenum using an existing air inlet port 18 and, optionally, recovering the vapor by condensation using a condensing system 28. A supplementary or alternative inlet plenum may be designed and provided for providing uniform flow through the machine.

FIG. 2 describes the layout of the electronic cooling system of this invention. In this embodiment, the mist is introduced at the base 26. A uniform flow of mist is providing for flooding the system and is pulled through by the exhaust fan 30 at the top of the diagramed system. If the vapor has to be recycled or condensed, the exhaust vapor enters the condenser 28 through the loop 32, and the liquid is fed back or returned to the misting chamber. Water could be condensed and sent back to the reservoir using an elaborate condenser system to provide distilled water to the misting device. Recovery may be important if hazardous or expensive chemicals are involved. If water is used, the vapor recovery may not be necessary, since the water can be exhausted. In lieu of recovery or in addition thereto, fresh liquid can also be added to the misting chamber.

Several conditions or variables may be manipulated to affect the cooling mechanics of the fine mist generated besides droplet quality. First, the mist concentration in the carrier medium can be varied to match the cooling need. Concentration may be varied by the combined manipulation of carrier medium flow rate through the system and the manipulation of inlet mist composition. Thus, the mist concentration that is provided and matched to the cooling need may varied by increasing the air flow rate to entrain a greater proportion of mist droplets being generated or deplete the number of mist droplets available to a volume of air flow to created a particular mass fraction or percent of misting liquid in the carrier gas or air flow.

Further, the mist generating capability may be varied by volume of water used in the mist generated, including anywhere from 0.1–1 liter or more per minute of liquid being used in generation of mist. Thus, increasing the mist generation rate may increase the mist concentration.

Moreover, the residence time of mist droplets inside the systems is matched to effectively vaporize and hence absorb the heat effectively. The residence time may be controlled through controlling concentration and flow pattern inside the systems or by controlling combinations of concentration, volume and flow pattern. For instance, the flow path may be varied or baffles and flow manipulators provided to vary the flow and velocity of the carrier gas and mist droplets, whereby residence time is manipulated. Further, the mist delivery may be intermittent to vary residence time, depending on the misting frequency required to cool the system as demanded, or the mist delivery may be provided from a predetermined plurality of sides to achieve optimum cooling.

Additionally, the composition of misting liquids may be varied to include dielectric liquids or liquids that do not effect electrical conduction. Thus, the benefits of the high latent heat of vaporization of water may be obtained while at the same time diminishing the risk of causing undesirable electrical conductivity by using a fluid combination having dielectric liquids therein. The composition could also be varied to control the rate of vaporization. Finally, the size of the mist droplets may be varied. Depending on liquid surface tension, nearly 100–500 nanometer-sized droplets can also be produced which will behave almost like an air-cooled gaseous system with an additional powerful cooling capacity of 26,000 kJ per 1 liter of water vaporized, providing the cooling power of all liquid type system.

Mist concentration, residence time of flow, and composition may be automated, and an automatic process feedback loop implemented to vary the various concentration, frequency, or composition to meet the heat load and cooling demand. Thereby, an automatically controlled mist cooling system may be provided to maintain a self-controlled system.

As mentioned above, the invention includes the alternative use of fine mist of various dielectric liquids, including but not limited to fluorocarbons. By way of example, properties of some fluorocarbons, but not all, are listed in table 1 below.

TABLE 1

Thermo physical properties of cooling liquids: fluorocarbons and water

| PROPERTY | FC-72 | FC-77 | $H_2O$ |
|---|---|---|---|
| Boiling Point (° C.) | 56 | 97 | 100 |
| Density × 10-3 (kg/m3) | 1.68 | 1.78 | 0.99 |
| Specific Heat × 10-3 (w-s/kg-K) | 1.08 | 1.17 | 4.17 |
| Thermal Conductivity (w/m-K) | 0.05 | 0.05 | 0.61 |
| Dynamic Viscosity × 104 (kg/m-s) | 4.50 | 4.50 | 8.55 |
| Heat of Vaporization × $10_L^{-4}$ (w-s/kg) | 8.79 | 8.37 | 243.8 |
| Surface Tension × $10^3$ (N/m) | 8.50 | 8.00 | 72.8 |
| Thermal Coefficient of Expansion × $10^3$ ($K^{-1}$) | 1.60 | 1.40 | 0.20 |
| Dielectric Constant | 1.72 | 1.75 | 78.0 |

The cooling effect of the process of the present invention is accomplished by a change of phase of mist droplets from liquid to vapor. Fluorocarbons have fairly low latent heats of vaporization due to the absence of hydrogen bonding. The excellent benefit of water as a coolant is water's capacity to cool provided by its high specific heat and large latent heat of vaporization, resulting in high latent heat absorption capability. As shown in table 1, water has roughly 28 times the latent heat of vaporization as compared to fluorocarbons. Further, water provides a cost-effective and simple process technology for implementation on existing air-cooled systems. Thus, water is the best candidate for huge heat removal needs but has heretofore been avoided or combined with other complicated process technology because of its damaging effect on equipment. Only in the form of a fog of extremely small droplets as taught by the present invention has water alone been safe and effective in cooling electronics and high-density power dissipation systems.

Figure 3:
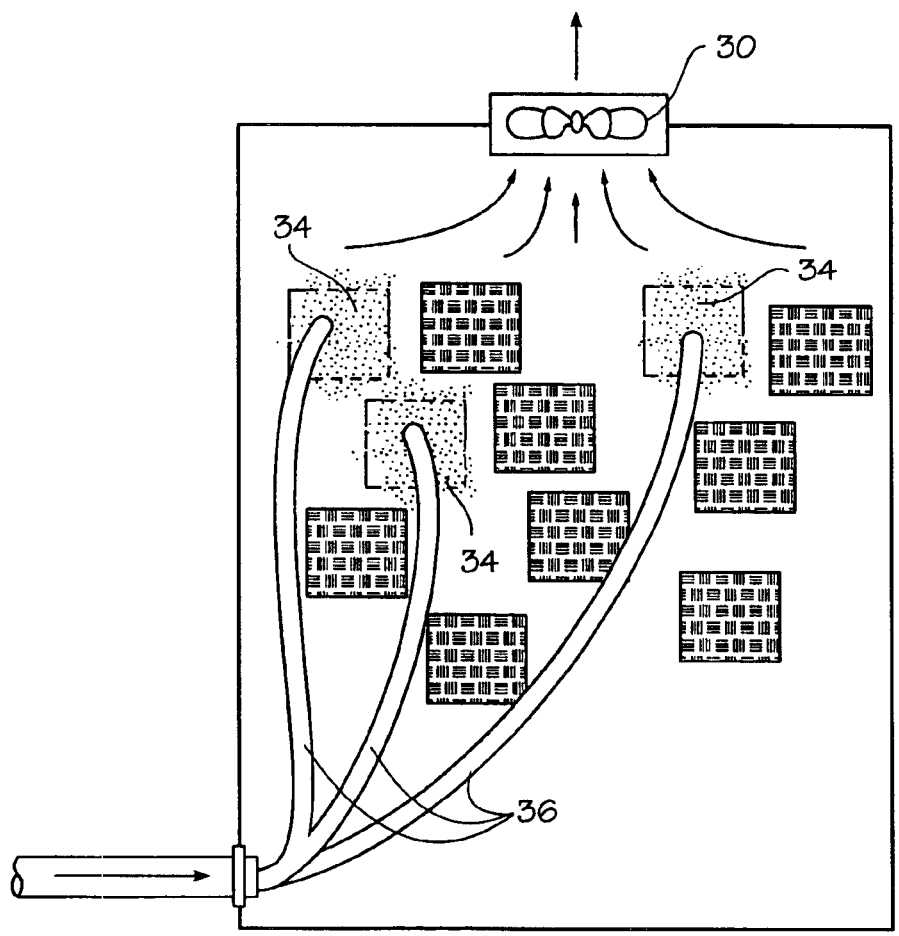
FIG. 3 shows electronics modules coated with hydrophobic dielectric substance and schematic of targeted mist deployment.

The process of the invention may be used as well in high power dissipation (>500 w) in variable speed motor devices needing heat removal capabilities far exceeding conventional change of phase liquids (COP) such as dielectric fluorocarbons. In addition, the process may be used as shown in FIG. 3, which shows another embodiment where mist is targeted to certain high heat release locations 34, which may be in addition to uniform flooding. This will reduce possible hot spots in high heating electronics systems. The method of FIG. 3 includes installing conduits 36 to direct the inlet flow partially into those locations where it is most needed. In another embodiment, mist may be generated in a central location and then transported to various cooling modules by way of several manifolds or conduits.

Systems cooled by the mist of the invention may vary from delicate electronics, computers, commercial-off-the-self electronics, densely packed military electronics and radar equipment, gun and missile controls, weaponry, high power density variable speed motor drives, cutting tools and any high density heat release items. In fact, the present invention is especially advantageous for high power output heating systems where only water with high latent of vaporization (2.6 J/kg) has been found effective in extracting the large amounts of heat needed for heat dissipation and effective thermal management.

The mist cooling method herein may also be used with high-speed cutting tools. Before a waterfall would sweep across the interface of the high-speed cutting surface. Vaporization of water is not efficient in this prior case because of the short residence time of the water with the heat-generating source. Whereas, a fine mist of high throughput as provided by the invention would cool the heat source instantaneously by allowing sufficient residence time of the mist for flooding the heat source, rather than the liquid coolant being swept away by gravity or the dynamic of the cutting tool. In addition, micro mist can cool more efficiently in cooling high speed cutting tools, as compared to a water-fall method, because of the increase surface area of droplets and the high vaporization and heat absorption rates.

Thus, micron mist flooding provides a non-invasive and easy to implement method of cooling existing electronic systems. The present micro-mist flooding/circulating method provides greater flexibility in ease of installation as compared to complicated spray impingement or spray cooling systems that require complex nozzle arrays and directed spray angles and configurations. No additional fluid handling systems are necessary for atomization, pumping and jet orientation, piping and installation of micro jets inside the electronics box. Vapor recovery by condensers and compressors is not necessary since water vapor can be exhausted out, which will reduce capital expenditure substantially.

We claim:

1. A method for cooling of a heat dissipating system or heat source element comprising the steps of:
   a. generating a mist comprising water, a dielectric liquid or a combination including water and a dielectric liquid, and having droplets of such fine scale as to deter the scale of the droplets of the mist causing deposition or impingement of the water mist onto surfaces of the heat dissipating system or onto the heat source element;
   b. directing the mist into the heat dissipating system or toward the heat source element; and
   c. providing a sufficiently low momentum of the mist as to deter the momentum of the mist causing deposition or impingement of the mist onto the surfaces of the heat dissipating system or onto the heat source element.

2. A method for cooling of a heat dissipating system or heat source element as in claim 1 that includes the additional step of governing throughout volume and concentration of the mist to cool the heat dissipating system or the heat source element.

3. A method for cooling of a heat dissipating system or heat source element as in claim 2 in which the heat dissipating system is an electronics system or commercial-off-the-shelf (COTS) system.

4. A method for cooling of a heat dissipating system or heat source element as in claim 2 in which the heat dissipating system is a variable speed motor.

5. A method for cooling of a beat dissipating system or heat source element as in claim 2 in which the mist is substantially comprised of droplets less than 10 micron in diameter.

6. A method for cooling of a heat dissipating system or heat source element as in claim 2 in which the mist is substantially comprised of droplets less than 5 micron in diameter.

7. A method for cooling of a heat dissipating system or heat source element as in claim 2 in which the step of directing the mist into the heat dissipating system or toward the heat source element includes directing the mist through a connection to a plenum of the heat dissipating system.

8. A method for cooling of a heat dissipating system or heat source element as in claim 2 in which the step of directing the mist into the heat dissipating system or toward the heat source element includes directing the mist through an existing cooling inlet of the heal dissipating system.

9. A method for cooling of a heat dissipating system or heat source element as in claim 2 in which the step of directing the mist into the heat dissipating system or toward the heat source element includes flooding the heat dissipating system with the mist.

10. A method for cooling of a heat dissipating system or heat source element as in claim 2 in which the step of directing the mist into the heat dissipating system or toward the heat source element includes directing the mist through a conduit to a desired heat source site.

11. A method for cooling of a heat dissipating system or heat source element as in claim 2 in which the step of directing the mist into the heat dissipating system or toward the heat source element includes a combination of flooding the heat dissipating system with the mist and directing the mist through a conduit to a desired heat source site.

12. A method for cooling of a heat dissipating system or heat source element as in claim 1 that includes the additional step of controlling the flow pattern of the mist inside the heat dissipating system or about the heat source element to govern the residence time of the mist within the heat dissipating system or about the heat source element.

13. A method for cooling of a heat dissipating system or heat source element as in claim 1 in which the step of directing the mist into the heat dissipating system or toward the heat source element includes introducing the mist from a predetermined plurality of sides of the heat dissipating system or the heal source elements.

14. A method for cooling of a heat dissipating system or heat source element as in claim 1 including the additional step of condensing the fluid after vaporization for recovery of at least a portion of the fluid.

15. A cooling apparatus, comprising a mist-generating device configured to generate a mist of droplets from water in which the mist has such momentum and concentration and quality so as to avoid impingement or deposition of the mist droplets on a surface to be cooled and protect the surface from harmful wetting.

16. A cooling apparatus as in claim 15 in which the mist-generating device includes an atomizer array.

17. A cooling apparatus as in claim 16 in which the atomizer array includes at least one electronic ultrasonic device arranged in the array for atomizing the fluid at ambient pressure.

18. A cooling apparatus as in claim 15 in which the mist-generating device includes an outlet for directing the mist of droplets and the apparatus includes at least one conduit attached to the outlet for delivering the mist near the surface to be cooled.

19. A cooling apparatus as in claim 15 in which the mist-generating device includes an outlet connected to an existing inlet of a heat dissipating system having the surface to be cooled.

20. A cooling apparatus as in claim 15 in which the water is provided in combination with at least one dielectric fluid.

21. A cooling apparatus comprising a mist-generating device configured to generate a mist of droplets from a fluid in which the mist has such momentum and concentration and quality so as to avoid impingement or deposition of the mist droplets on a surface to be cooled and protect the surface from harmful wetting; the mist generating device includes an atomizer array with at least one electronic ultrasonic device arranged in the array for atomizing the fluid at ambient pressure; and the mist-generating device includes a carrier medium source arranged with respect to each electronic ultrasonic device as to cause a carrier medium to flow tangential to a plume generated by each ultrasonic device and create a helical flow for classifying and creating the desired quality of the mist.

22. A cooling system comprising a surface to be cooled and a device producing a fine mist from a fluid so as to attain a protective boundary layer of heat transfer between the surface to be cooled and the mist that protects the surface from harmful wetting by buffering the surface from contact with the mist without the assistance of a thin film or other coating on the surface, the device producing the fine mist including means for controlling than volume momentum and quality of mist droplets so as to attain the mist having the required volume, momentum and quality to attain the protective boundary layer of heat transfer.

23. A cooling system as in claim 22 in which the protective boundary layer of heat transfer is augmented by coating the surface to be cooled with a protective material.

24. A cooling system as in claim 22 in which the means for controlling the volume, momentum and quality of mist droplets includes a control feedback from the surface to be cooled to the device producing the fine mist for adjusting either volume, momentum or quality of mist droplet.

25. A cooling system comprising a surface to be cooled and a device producing a fine mist from a fluid so as to attain a protective boundary layer or heat transfer between the surface to be cooled and the mist that protects the surface from harmful wetting by buffering the surface from contact with the mist without the assistance of a thin film or other coating on the surface;

the device producing the fine mist includes means for controlling the volume, momentum and quality of mist droplets so as to attain the mist having the required volume, momentum and quality to attain the protective boundary layer of heat transfer, and the means for controlling the volume, momentum and quality of mist droplets includes a housing having an array of at least one ultrasonic transducer devices for atomizing the fluid and generating the mist, the housing further comprising a carrier medium inlet for directing a carrier medium tangential to a mist column created by atomizing the fluid, at least one mist supply outlet, the mist supply outlet connected by an existing cooling medium inlet to a plenum of a heat dissipating system for flooding the heat dissipating system with the mist.

* * * * *